(12) United States Patent
Lee et al.

(10) Patent No.: US 8,362,790 B2
(45) Date of Patent: Jan. 29, 2013

(54) AC DETECTION CIRCUIT FOR POWER SUPPLY

(75) Inventors: Sung Uk Lee, Gyunggi-Do (KR); Dong Kyun Ryu, Seoul (KR); Kyung Hyun Kim, Seoul (KR); Seung Heun Yang, Gyunggi-Do (KR); Tai Sung Kim, Seoul (KR); Jae Han Yoon, Gyunggi-Do (KR); Peel Sik Jeon, Gyunggi-Do (KR); Yun Seop Shin, Gyunggi-Do (KR); Kyung Su Han, Gyunggi-Do (KR)

(73) Assignee: Samsung Electro-Mechanics Co., Ltd., Gyunggi-do (KR)

( * ) Notice: Subject to any disclaimer, the term of this patent is extended or adjusted under 35 U.S.C. 154(b) by 554 days.

(21) Appl. No.: 12/629,741

(22) Filed: Dec. 2, 2009

(65) Prior Publication Data

US 2010/0321000 A1    Dec. 23, 2010

(30) Foreign Application Priority Data

Jun. 19, 2009    (KR) .................. 10-2009-0055106
Jun. 19, 2009    (KR) .................. 10-2009-0055107

(51) Int. Cl.
*G01R 27/08*    (2006.01)
*H02M 3/24*    (2006.01)

(52) U.S. Cl. ......................... 324/713; 363/76
(58) Field of Classification Search .................. 324/713; 363/76
See application file for complete search history.

(56) References Cited

U.S. PATENT DOCUMENTS

| 3,800,095 | A | * | 3/1974 | Cowpland | ................ | 379/395.01 |
|---|---|---|---|---|---|---|
| 4,328,433 | A | | 5/1982 | Nodera et al. | | |
| 5,864,110 | A | * | 1/1999 | Moriguchi et al. | ...... | 219/121.57 |
| 6,885,016 | B2 | * | 4/2005 | Worley et al. | ................. | 250/551 |
| 6,903,319 | B2 | * | 6/2005 | Suenaga et al. | ............... | 219/715 |
| 7,529,107 | B2 | | 5/2009 | Mehta | | |
| 2005/0140344 | A1 | * | 6/2005 | Wenzel | .......................... | 323/223 |
| 2008/0074909 | A1 | * | 3/2008 | Mehta | ............................. | 363/52 |

FOREIGN PATENT DOCUMENTS

KR    1020090027010 A    3/2009
KR    1020090041216 A    4/2009

OTHER PUBLICATIONS

Korean Office Action for Application No. 10-2009-0055106, issued Nov. 25, 2010.
Korean Office Action for Application No. 10-2009-0055107, issued Nov. 25, 2010.
Chinese Office Action for Application No. 200910251201.8 mailed Jun. 14, 2012.

* cited by examiner

*Primary Examiner* — Jeff Natalini
(74) *Attorney, Agent, or Firm* — Lowe Hauptman Ham & Berner, LLP

(57) ABSTRACT

There is provided an alternating current (AC) detection circuit for a power supply, the circuit including: a rectifying part rectifying an AC voltage; a voltage division part dividing the voltage rectified by the rectifying part according to a preset division ratio; a voltage stabilization circuit part stabilizing the voltage divided by the voltage division part; a comparing part comparing the voltage stabilized by the voltage stabilization circuit part with an internal reference voltage and generating an input detection signal when the stabilized voltage is higher than the internal reference voltage; and an output part outputting an AC detection signal when the input detection signal is inputted from the comparing part.

8 Claims, 5 Drawing Sheets

AC DETECTION CIRCUIT FOR POWER SUPPLY

CROSS-REFERENCE TO RELATED APPLICATIONS

This application claims the priorities of Korean Patent Application Nos. 10-2009-0055106 filed on Jun. 19, 2009 and 10-2009-0055107 filed on Jun. 19, 2009, in the Korean Intellectual Property Office, the disclosures of which are incorporated herein by reference.

BACKGROUND OF THE INVENTION

1. Field of the Invention

The present invention relates to an alternating current (AC) detection circuit applicable to a power supply such as that of a plasma display panel (PDP), and more particularly, to an AC detection circuit for power supply, which is configured to detect an AC using a comparing part such as a shunt regulator, and a transistor.

2. Description of the Related Art

In general, a switching mode power supply (SMOS) applicable to a plasma display panel (PDP) TV set employs a sequence circuit so as to protect a PDP driving board. In order to employ such a sequence circuit, an alternating current (AC) detection circuit detecting AC input is required, as well as a brownout circuit blocking the sequence circuit when a low voltage is inputted.

An AC detection signal outputted from an AC detection circuit is commonly created in a direct current (DC) waveform and a square waveform, according to an AC signal's forms.

In an AC detection circuit employing the DC waveform, a sequence circuit is controlled and a brownout circuit is configured by using a Zener diode and a transistor.

Like this, a configuration using the Zener diode and the transistor uses an excessive resistance value in an input port so as to reduce influences of standby power consumption and embody the operation characteristics of the sequence circuit and the brownout circuit, thereby causing circuit design review (CDR) problems in the case of the Zener diode and the transistor. Also, there are many required components, so the problem of cost is encountered.

The following descriptions are of circuits detecting an AC voltage using a Zener diode according to the related art. An AC detection circuit employing a DC waveform is configured to be active high by using a transistor, a Zener diode, and a photodiode. Such a circuit uses approximately twenty-seven components.

This circuit is configured to perform the conversion of an AC voltage to a DC voltage using a first Zener diode and a capacitor such as a ceramic capacitor or a film capacitor, allowing a current to flow through a second Zener diode when the converted voltage is higher than a breakdown voltage in the second Zener diode, causing the current to operate a transistor, and generating an AC detection signal accordingly.

Since such an AC detection circuit according to the related art uses the Zener diode and the transistor, a complex circuit configuration is required for a bias and the protection of the Zener diode from surges. This causes an increase in the number of components, resulting in an increase in the area required for the increased components and a production cost.

SUMMARY OF THE INVENTION

An aspect of the present invention provides an alternating current (AC) detection circuit for power supply, which is configured to detect an AC using a comparing part such as a shunt regulator, and a transistor, thereby reducing the number of components used.

According to an aspect of the present invention, there is provided an AC detection circuit, the circuit including: a rectifying part rectifying an AC voltage; a voltage division part dividing the voltage rectified by the rectifying part according to a preset division ratio; a voltage stabilization circuit part stabilizing the voltage divided by the voltage division part; a comparing part comparing the voltage stabilized by the voltage stabilization circuit part with an internal reference voltage and generating an input detection signal when the stabilized voltage is higher than the internal reference voltage; and an output part outputting an AC detection signal when the input detection signal is inputted from the comparing part.

The rectifying part may be a half-wave rectifying part half-wave rectifying the AC voltage.

The voltage division part may include a plurality of resistors connected in series between an output part of the rectifying part and a ground.

The voltage stabilization circuit part may include a first capacitor connected between a first division node preset in the voltage division part and the ground, and a second capacitor connected between a second division node and the ground, the second division node disposed between the first division node and the ground.

The comparing part may be a shunt regulator including a cathode connected to the output part, an input port connected to an output port of the voltage stabilization circuit part, and an anode connected to the ground.

The output part may include an NPN transistor including a base connected to the cathode of the shunt regulator and concurrently connected to a first operation voltage through a resistor, a collector connected to an output port outputting the AC detection signal and the first operation voltage, and an emitter connected to the ground.

The output part may include a first output part and a second output part. The first output part may include an NPN transistor including a base connected to the cathode of the shunt regulator, a collector connected to the second output part and a first output port outputting a first AC detection signal, and an emitter connected to the ground. The second output part may be configured as a photocoupler including an anode connected to the first operation voltage and concurrently connected to a second output port outputting a second AC detection signal, a photodiode connected to the collector of the NPN transistor, and a phototransistor including a collector connected to a second operation voltage, a base receiving light from the photodiode, and an emitter connected to the ground.

The output part may include a PNP transistor including a base connected to the cathode of the shunt regulator and concurrently connected to a first operation voltage through a resistor, a collector connected to an output port outputting the AC detection signal, and an emitter connected to the first operation voltage.

The output part may include a first output part and a second output part. The first output part may include a PNP transistor including a base connected to the cathode of the shunt regulator and concurrently connected to a first operation voltage through a resistor, a collector connected to a first output port outputting a first AC detection signal, and an emitter connected to the second output part. The second output part may be configured as a photocoupler including an anode connected to the first operation voltage, a photodiode connected to the emitter of the PNP transistor, and a phototransistor including a collector connected to a second operation voltage, a base receiving light from the photodiode, and an emitter connected to a second output port outputting a second AC detection signal.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Exemplary embodiments of the present invention will now be described in detail with reference to the accompanying drawings.

The invention may, however, be embodied in many different forms and should not be construed as being limited to the exemplary embodiments set forth herein. The exemplary embodiments are provided to assist in a comprehensive understanding of the invention.

Figure 1:
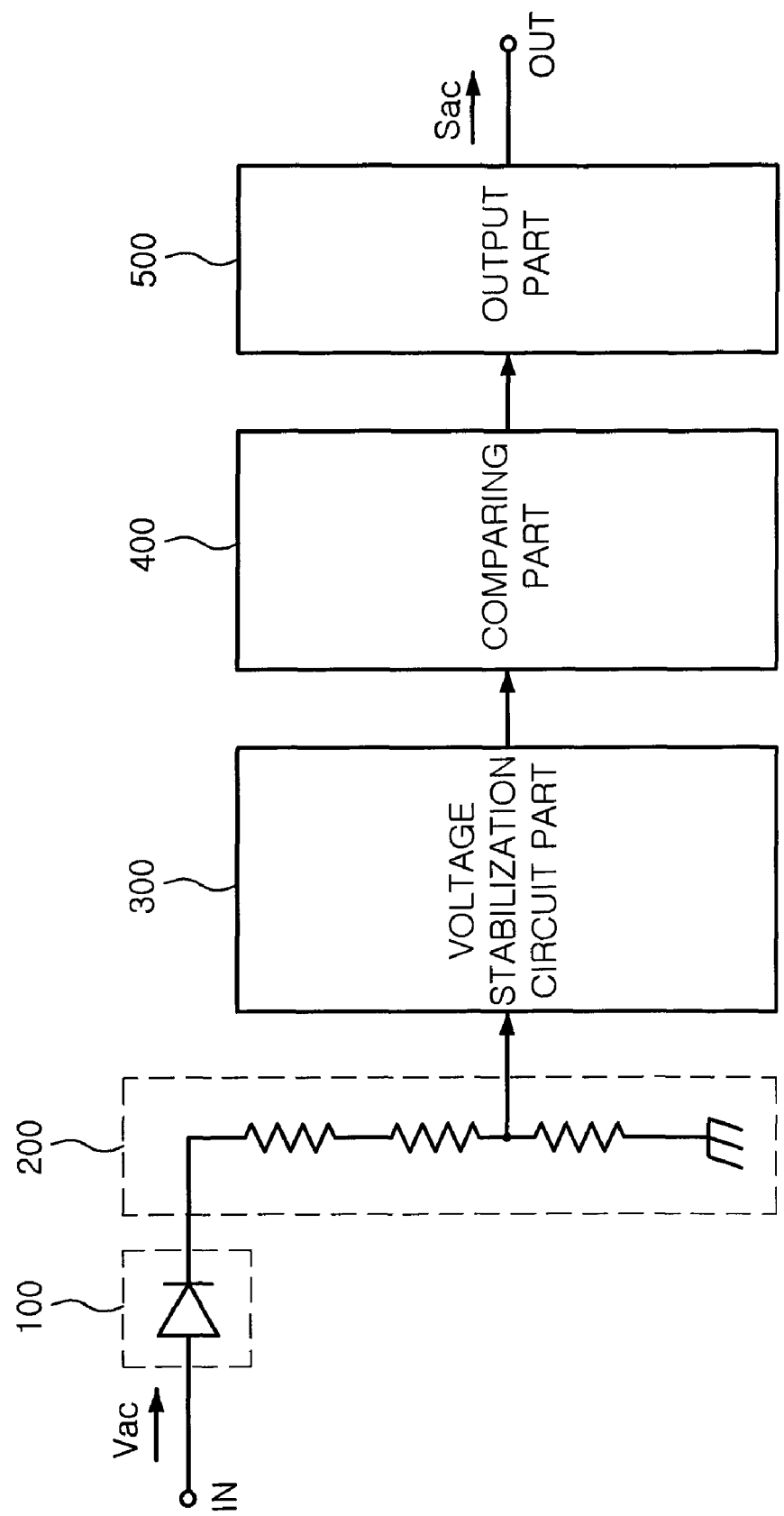
FIG. 1 is a block diagram illustrating an alternating current (AC) detection circuit for power supply according to an exemplary embodiment of the present invention.

FIG. 1 is a block diagram illustrating an alternating current (AC) detection circuit for power supply according to an exemplary embodiment of the present invention.

Referring to FIG. 1, an AC detection circuit for power supply according to this embodiment includes a rectifying part 100 rectifying an AC voltage Vac inputted from an input port IN; a voltage division part 200 dividing the voltage rectified by the rectifying part 100 according to a preset division ratio; a voltage stabilization circuit part 300 stabilizing the voltage divided by the voltage division part 200; a comparing part 400 comparing the voltage stabilized by the voltage stabilization circuit part 300 with an internal reference voltage and generating an input detection signal when the stabilized voltage is higher than the internal reference voltage; and an output part 500 outputting an AC detection signal Sac when the input detection signal is inputted from the comparing part 400.

Figure 2:
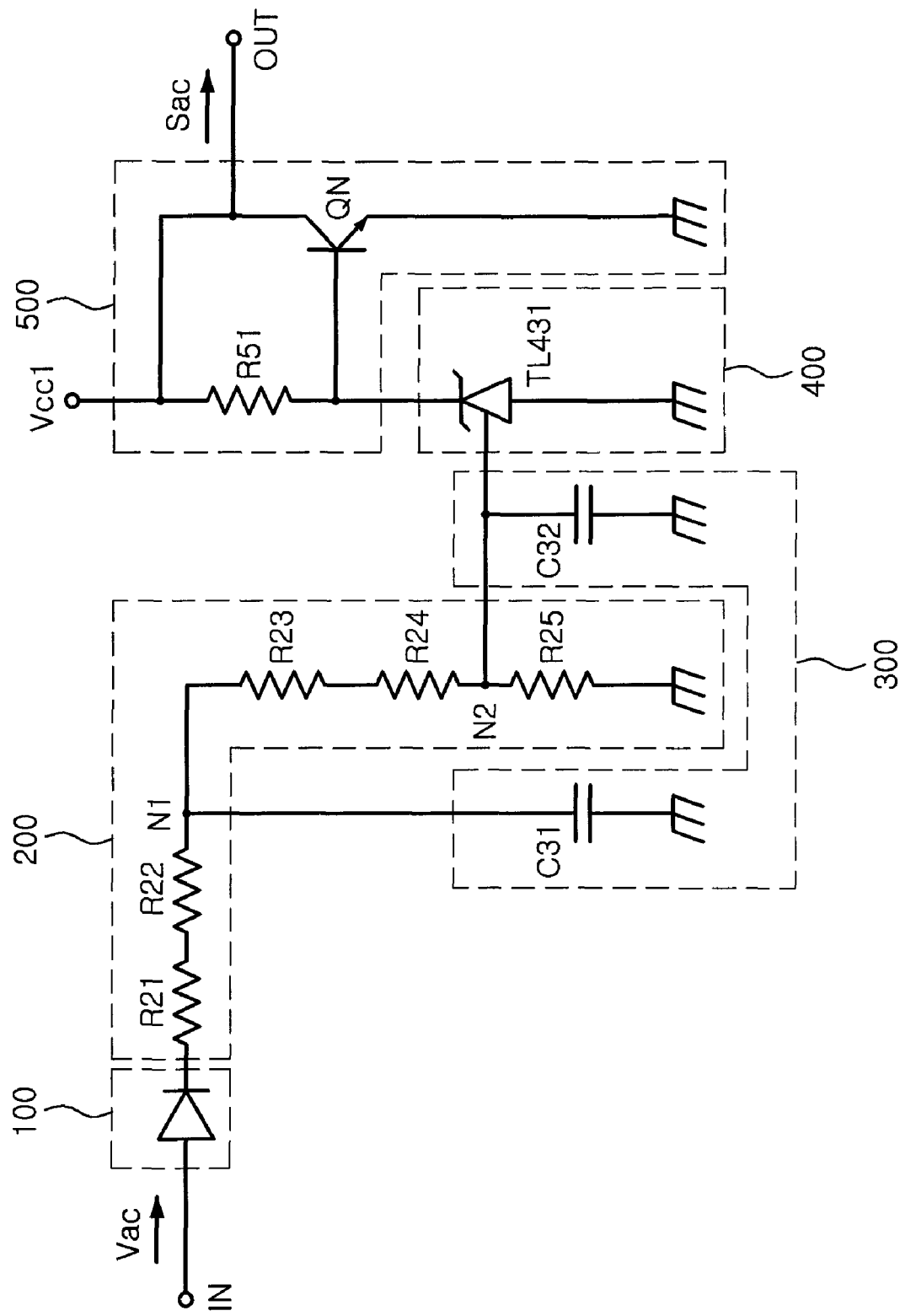
FIG. 2 illustrates the configuration for an AC detection circuit for power supply according to an exemplary embodiment of the present invention.
Figure 3:
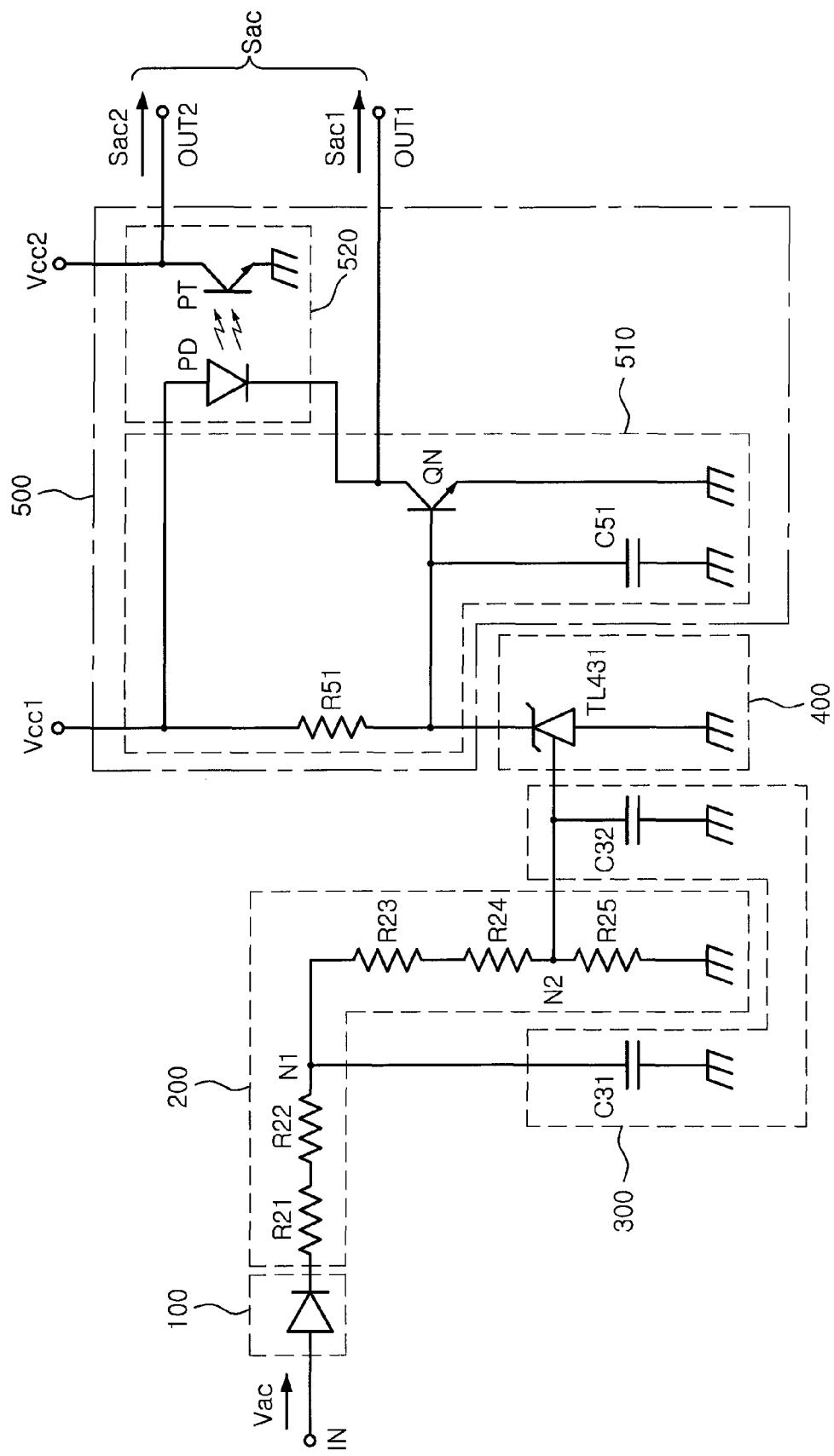
FIG. 3 illustrates another configuration for an output part of FIG. 2.
Figure 4:
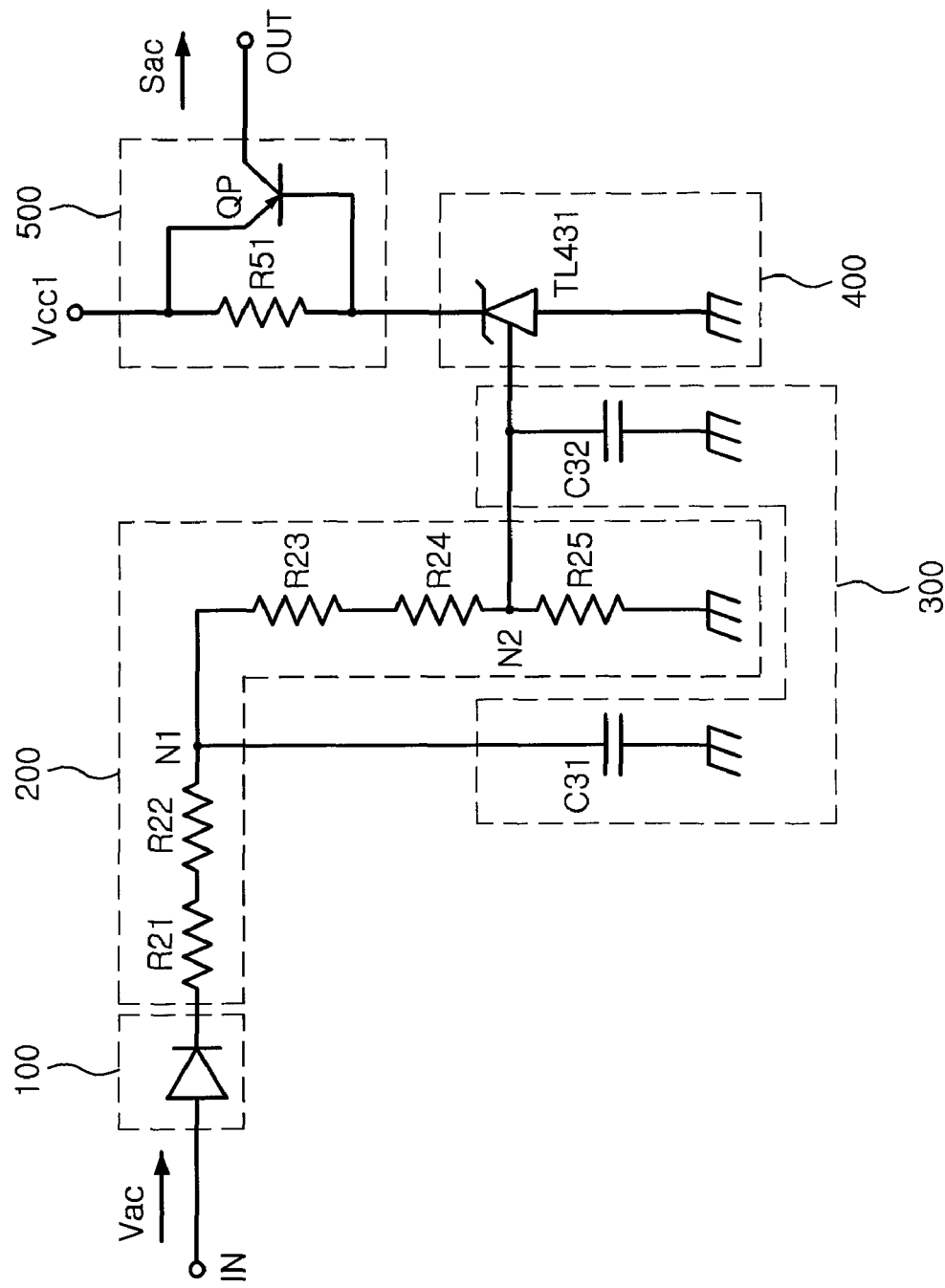
FIG. 4 illustrates the configuration for an AC detection circuit for power supply according to another exemplary embodiment of the present invention.
Figure 5:
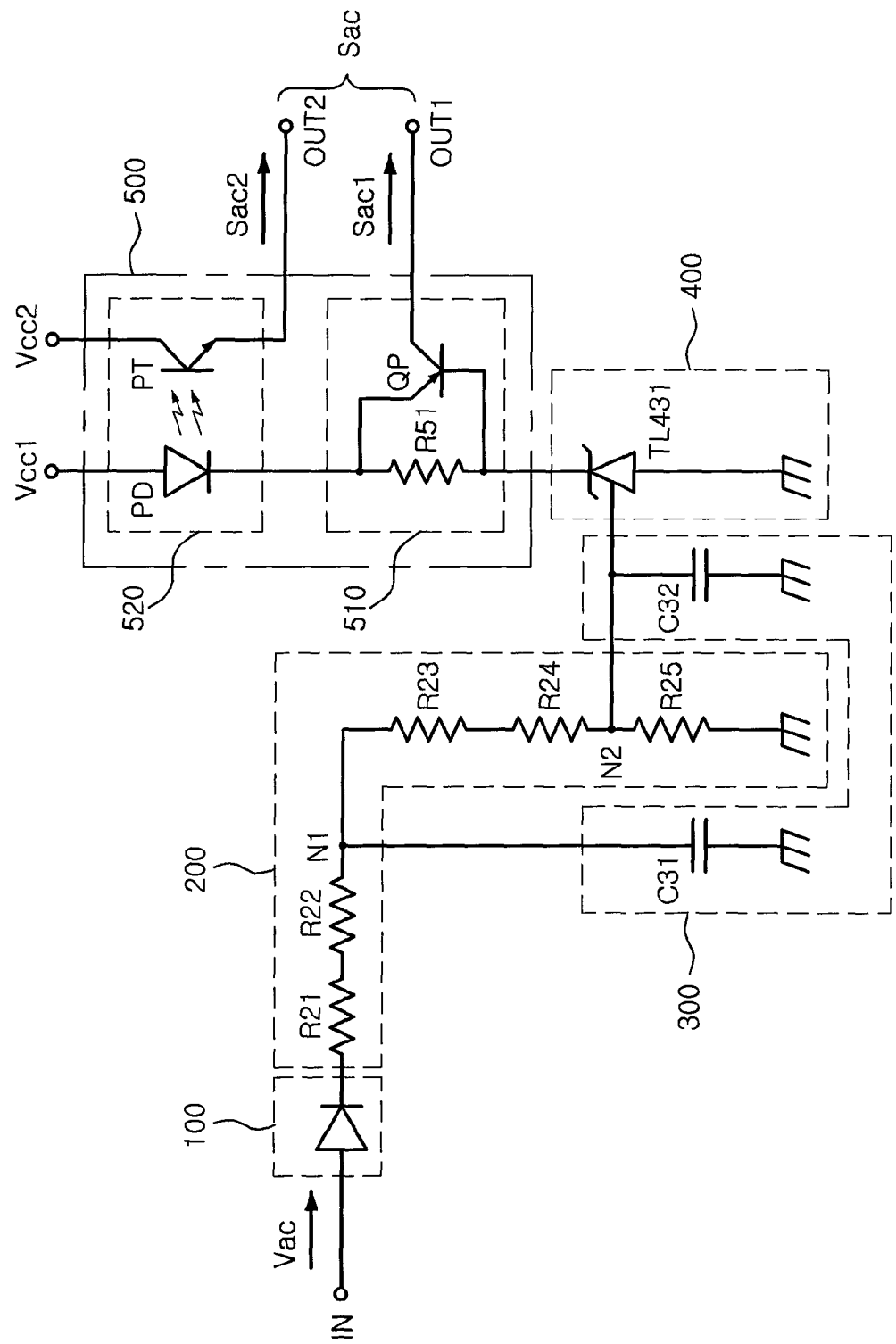
FIG. 5 illustrates another configuration for an output part of FIG. 4.

FIG. 2 illustrates the configuration for an AC detection circuit for power supply according to an exemplary embodiment of the present invention. FIG. 3 illustrates another configuration for an output part of FIG. 2. FIG. 4 illustrates the configuration for an AC detection circuit for power supply according to another exemplary embodiment of the present invention. FIG. 5 illustrates another configuration for an output part of FIG. 4.

In FIGS. 2 through 5, the rectifying part 100 may be a half-wave rectifying part, half-wave rectifying the AC voltage Vac. For example, the half-wave rectifying part may be configured as a rectifying diode.

The voltage division part 200 may include a plurality of resistors R21 to R25 connected in series between an output port of the rectifying part 100 and a ground. Here, the number of the series-connected resistors or the resistance values thereof may be variable according to the actual states of a power supply.

The voltage stabilization circuit part 300 may include a first capacitor C31 connected between a first division node N1, preset in the voltage division part 200, and the ground, and a second capacitor C32 connected between a second division node N2, disposed between the first division node N1 and the ground, and the ground, so as to improve voltage detection accuracy.

The comparing part 400 may be configured as a shunt regulator including a cathode connected to the output part 500, an input port connected to an output port of the voltage stabilization circuit part 300, and an anode connected to the ground. For example, the shunt regulator may be configured as a TL431 device.

Referring to FIG. 2, the output part 500 may include an NPN transistor QN having a base connected to the cathode of the shunt regulator and concurrently connected to a first operation voltage Vcc1 through a resistor R51, a collector connected to an output port OUT outputting an AC detection signal Sac and the first operation voltage Vcc1, and an emitter connected to the ground.

Referring to FIG. 3, the output part 500 may include a first output part 510 and a second output part 520. Here, the first output part 510 may include an NPN transistor QN having a base connected to the cathode of the shunt regulator and concurrently connected to the ground through a capacitor C51, a collector connected to the second output part 520 and a first output port OUT1 outputting a first AC detection signal Sac1, and an emitter connected to the ground.

Also, the second output part 520 may be configured as a photocoupler including an anode connected to a first operation voltage Vcc1 and concurrently connected to a second output port OUT2 outputting a second AC detection signal Sac2, a photodiode PD connected to the collector of the NPN transistor QN, and a phototransistor PT having a collector connected to a second operation voltage Vcc2, a base receiving light from the photodiode PD, and an emitter connected to the ground.

Referring to FIG. 4, the output part 500 may include a PNP transistor QP having a base connected to the cathode of the shunt regulator and concurrently connected to a first operation voltage Vcc1 through a resistor R51, a collector connected to an output port OUT outputting an AC detection signal Sac, and an emitter connected to the first operation voltage Vcc1.

Referring to FIG. 5, the output part 500 may include a first output part 510 and a second output part 520. Here, the first output part 510 may include a PNP transistor QP having a base connected to the cathode of the shunt regulator and concurrently connected to a first operation voltage Vcc1 through a resistor R51, a collector connected to a first output port OUT1 outputting a first AC detection signal Sac1, and an emitter connected to the second output part 520.

The second output part 520 may be configured as a photocoupler including an anode connected to the first operation voltage Vcc1, a photodiode PD connected to the emitter of the PNP transistor QP, and a phototransistor PT having a collector connected to a second operation voltage Vcc2, a base receiving light from the photodiode PD, and an emitter connected to a second output port OUT2 outputting a second AC detection signal Sac2.

Hereinafter, the operation and effect of the invention will be described in detail with reference to the accompanying drawings.

Referring to FIG. 1, the AC detection circuit for power supply according to this embodiment may include the rectifying part 100, the voltage division part 200, the voltage stabilization circuit part 300, the comparing part 400, and the output part 500.

Here, the rectifying part 100 halfwave rectifies an AC voltage Vac of 90V or more and outputs the rectified voltage to the voltage division part 200.

The voltage division part 200 divides the rectified voltage according to a preset division ratio. For example, the voltage division part 200 includes a plurality of resistors having resistance values which are set such that the AC voltage is divided into a higher voltage than an internal reference voltage of the comparing part 400 in a normal state.

The voltage stabilization circuit part 300 stabilizes the voltage divided by the voltage division part 200 so as to improve voltage detection accuracy, and then supplies the stabilized voltage to the comparing part 400. Accordingly, the comparing part 400 may be able to operate more accurately.

Then, the comparing part 400 compares the stabilized voltage inputted from the voltage stabilization circuit part 300 with the internal reference voltage. If the stabilized voltage is higher than the internal reference voltage, an input detection signal is generated. If not, the input detection signal is not generated.

Then, the output part 500 outputs an AC detection signal Sac when the input detection signal is inputted from the comparing part 400.

In FIGS. 2 through 5, the rectifying part 100 may be configured as the rectifying diode. The rectifying part 100 half-wave rectifies the AC voltage Vac and outputs the rectified voltage to the voltage division part 200.

The voltage division part 200 may include the plurality of resistors R21 to R25 connected in series between the output port of the rectifying part 100 and the ground. The voltage division part 200 divides the voltage according to voltage division ratio of those resistors.

The voltage stabilization circuit part 300 may include the first capacitor C31 and the second capacitor C32. Here, the first capacitor C31 stabilizes a voltage between the first division node N1, preset in the voltage division part 200, and the ground. Also, the second capacitor C32 stabilizes a voltage between the second division node N2, disposed between the first division node N1 and the ground, and the ground.

Here, the voltage stabilization circuit part 300 may only include the second capacitor C32. However, when the voltage stabilization circuit part 300 includes both the first and second capacitors C31 and C32, voltage stabilization may be further improved.

For example, the comparing part 400 may be configured as the shunt regulator including the cathode connected to the output part 500, the input port connected to the output port of the voltage stabilization circuit part 300, and the anode connected to the ground.

Now, when the comparing part 400 is configured as the shunt regulator, the configurations for the output part 500 will be described with reference to FIGS. 2 through 5. Here, the shunt regulator turns on when an input voltage is higher than an internal reference voltage, otherwise it turns off.

Hereinafter, the configuration for the output part 500 according to an exemplary embodiment of the invention will be described with reference to FIGS. 2 and 3.

Referring to FIG. 2, when the shunt regulator turns on, the voltage between the base and the emitter of the NPN transistor QN in the output part 500 is lower than a turn-on voltage, so the NPN transistor QN of the output part 500 turns off. Accordingly, a high-level AC detection signal Sac is outputted through the output port OUT.

In contrast, when the shunt regulator turns off, a first operation voltage Vcc1 is supplied to the base of the NPN transistor QN. Since the voltage between the base and the emitter of the NPN transistor QN is higher than the turn-on voltage, the NPN transistor QN of the output part 500 turns on, and thus the output port OUT is connected to the ground through the NPN transistor QN. Accordingly, no AC detection signal Sac is outputted through the output port OUT.

Referring to FIG. 3, the output part 500 may include the first output part 510 supplying a first AC detection signal Sac1 to a primary side of a power transformer, and the second output port 520 supplying a second AC detection signal Sac2 to a secondary side of the power transformer.

Here, when the shunt regulator turns on, the voltage between the base and the emitter of the NPN transistor QN is lower than a turn-on voltage, so the NPN transistor QN of the first output part 510 turns off. Accordingly, a high-level first AC detection signal Sac1 is outputted through the first output port OUT1 connected to the first operation voltage Vcc1.

Also, when the shunt regulator turns on, the NPN transistor QN turns off, so the current flowing through the photodiode PD of the photocoupler in the second output part 520 is not coupled to the phototransistor PT. Accordingly, the phototransistor PT fails to operate, and thus the second operation voltage Vcc2 is outputted as a second AC detection signal Sac2 through the second output port OUT2.

In contrast, when the shunt regulator turns off, the first operation voltage Vcc1 is supplied to the base of the NPN transistor QN. Since the voltage between the base and the emitter of the NPN transistor QN is higher than the turn-on voltage, the NPN transistor QN of the first output part 510 turns on. At this time, a base voltage of the NPN transistor QN is stabilized by the capacitor C51 connected to the base of the NPN transistor QN, and the first output port OUT1 is connected to the ground through the NPN transistor QN. Accordingly, no first AC detection signal Sac1 is outputted through the first output port OUT1.

Also, the current is coupled through the photocoupler of the second output part 520, and the phototransistor PT operates such that the second operation voltage Vcc2 is connected to the ground. Accordingly, no second AC detection signal Sac2 is outputted.

Hereinafter, the configuration for the output part 500 according to another exemplary embodiment of the invention will be described with reference to FIGS. 4 and 5.

Referring to FIG. 4, when the shunt regulator turns on, the voltage between the emitter and the base of the PNP transistor QP in the output part 500 is higher than a turn-on voltage, so the PNP transistor QP of the output part 500 turns on. Accordingly, a high-level AC detection signal Sac is outputted through the output port OUT that is connected to the first operation voltage Vcc1 through the PNP transistor QP.

In contrast, when the shunt regulator turns off, the PNP transistor QP also turns off. Accordingly, no AC detection signal Sac is outputted through the output port OUT.

Referring to FIG. 5, the output part 500 may include the first output part 510 supplying a first AC detection signal Sac1 to a primary side of a power transformer, and the second output part 520 supplying a second AC detection signal Sac2 to a secondary side of the power transformer.

When the shunt regulator turns on, the voltage between the emitter and the base of the PNP transistor QP included in the first output part 510 of the output part 500 is higher than a turn-on voltage, so the PNP transistor QP of the first output part 510 turns on. Accordingly, a high-level first AC detection signal Sac1 is outputted through the first output port OUT1 that is connected to the first operation voltage Vcc1 through the PNP transistor QP.

Also, the current flowing through the photodiode PD of the photocoupler of the second output part 520 is coupled to the phototransistor PT, and thus the second AC detection signal Sac2 is outputted through the second output port OUT2 that is connected to the second operation voltage Vcc2 through the phototransistor PT.

In contrast, when the shunt regulator turns off, the PNP transistor QP of the first output part 510 also turns off. Accordingly, no first AC detection signal Sac1 is outputted through the first output port OUT1.

Also, when the shunt regulator turns off, the current fails to flow through the photodiode PD and the phototransistor PT in the second output part, so the current fails to be coupled through the photocoupler of the second output part 520. Accordingly, no second AC detection signal Sac2 is outputted through the second output port OUT2.

As described above, as compared to a conventional circuit using a Zener diode, this invention provides the advantages of a great reduction in the number of components used and costs. Also, an AC voltage, applicable to a power supply such as that of a plasma display panel (PDP) is detected, and an AC detection signal can be supplied to the secondary side of the power transformer as well as the primary side thereof.

As set forth above, according to exemplary embodiments of the invention, the AC detection circuit applicable to a power supply such as that of the PDP is configured to detect the AC using the comparing part such as the shunt regulator and the transistor, whereby the number of components used is greatly reduced and the costs are reduced accordingly.

While the present invention has been shown and described in connection with the exemplary embodiments, it will be apparent to those skilled in the art that modifications and variations can be made without departing from the spirit and scope of the invention as defined by the appended claims.

What is claimed is:

1. An alternating current (AC) detection circuit, comprising:
   a rectifying part for rectifying an AC voltage;
   a voltage division part for dividing the voltage rectified by the rectifying part according to a preset division ratio;
   a voltage stabilization circuit part for stabilizing the voltage divided by the voltage division part;
   a comparing part for comparing the voltage stabilized by the voltage stabilization circuit part with an internal reference voltage and generating an input detection signal when the stabilized voltage is higher than the internal reference voltage; and
   an output part for outputting first and second AC detection signal signals when the input detection signal is inputted from the comparing part, wherein
   the comparing part comprises a shunt regulator including:
      a cathode connected to the output part;
      an input port connected to an output port of the voltage stabilization circuit part; and
      an anode connected to a ground,
   the output part comprises a first output part and a second output part,
   the first output part comprises an NPN transistor including:
      a base connected to the cathode of the shunt regulator;
      a collector connected to the second output part and a first output port for outputting the first AC detection signal; and
      an emitter connected to the ground, and
   the second output part is configured as a photocoupler comprising:
      an anode connected to receive a first operation voltage and concurrently connected to a second output port for outputting the second AC detection signal;
      a photodiode connected to the collector of the NPN transistor; and
      a phototransistor including a collector connected to receive a second operation voltage, a base for receiving light from the photodiode, and an emitter connected to the ground.

2. The AC detection circuit of claim 1, wherein the rectifying part is a half-wave rectifying part for half-wave rectifying the AC voltage.

3. The AC detection circuit of claim 1, wherein the voltage division part comprises a plurality of resistors connected in series between an output port of the rectifying part and the ground.

4. The AC detection circuit of claim 1, wherein the voltage stabilization circuit part comprises:
   a first capacitor connected between a first division node preset in the voltage division part and the ground; and
   a second capacitor connected between a second division node and the ground, the second division node disposed between the first division node and the ground.

5. An alternating current (AC) detection circuit, comprising:
   a rectifying part for rectifying an AC voltage;
   a voltage division part for dividing the voltage rectified by the rectifying part according to a preset division ratio;
   a voltage stabilization circuit part for stabilizing the voltage divided by the voltage division part;
   a comparing part for comparing the voltage stabilized by the voltage stabilization circuit part with an internal reference voltage and generating an input detection signal when the stabilized voltage is higher than the internal reference voltage; and
   an output part for outputting first and second AC detection signals when the input detection signal is inputted from the comparing part, wherein
   the comparing part comprises a shunt regulator including:
      a cathode connected to the output part,
      an input port connected to an output port of the voltage stabilization circuit part, and
      an anode connected to a ground,
   the output part comprises a first output part and a second output part,
   the first output part comprises a PNP transistor including:
      a base connected to the cathode of the shunt regulator and concurrently connected to receive a first operation voltage through a resistor,
      a collector connected to a first output port for outputting the first AC detection signal, and
      an emitter connected to the second output part, and
   the second output part is configured as a photocoupler comprising:
      an anode connected to receive the first operation voltage,
      a photodiode connected to the emitter of the PNP transistor, and
      a phototransistor including a collector connected to receive a second operation voltage, a base for receiving light from the photodiode, and an emitter connected to a second output port for outputting the second AC detection signal.

6. The AC detection circuit of claim 5, wherein the rectifying part is a half-wave rectifying part for half-wave rectifying the AC voltage.

7. The AC detection circuit of claim 5, wherein the voltage division part comprises a plurality of resistors connected in series between an output port of the rectifying part and the ground.

8. The AC detection circuit of claim 5, wherein the voltage stabilization circuit part comprises:
   a first capacitor connected between a first division node preset in the voltage division part and the ground; and
   a second capacitor connected between a second division node and the ground, the second division node disposed between the first division node and the ground.

* * * * *